US012666674B2

(12) United States Patent (10) Patent No.: US 12,666,674 B2
Eshun (45) Date of Patent: Jun. 23, 2026

(54) WIDE BANDGAP MATERIAL IN DRIFT WELL OF SEMICONDUCTOR DEVICE

(71) Applicant: TEXAS INSTRUMENTS INCORPORATED, Dallas, TX (US)

(72) Inventor: Ebenezer Eshun, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 418 days.

(21) Appl. No.: 18/309,504

(22) Filed: Apr. 28, 2023

(65) Prior Publication Data

US 2024/0363691 A1    Oct. 31, 2024

(51) Int. Cl.
| | |
|---|---|
| *H10D 62/17* | (2025.01) |
| *H10D 30/01* | (2025.01) |
| *H10D 30/65* | (2025.01) |
| *H10D 62/10* | (2025.01) |
| *H10D 62/82* | (2025.01) |
| *H10D 62/822* | (2025.01) |
| *H10D 62/832* | (2025.01) |
| *H10D 62/85* | (2025.01) |
| *H10D 84/83* | (2025.01) |
| *H10P 14/20* | (2026.01) |
| *H10P 14/24* | (2026.01) |

(52) U.S. Cl.
CPC ....... *H10D 62/393* (2025.01); *H10D 30/0281* (2025.01); *H10D 30/65* (2025.01); *H10D 62/116* (2025.01); *H10D 62/82* (2025.01); *H10D 62/822* (2025.01); *H10D 62/8325* (2025.01); *H10D 62/8503* (2025.01); *H10D 84/83* (2025.01); *H10P 14/24* (2026.01); *H10P 14/3408* (2026.01); *H10P 14/3416* (2026.01)

(58) Field of Classification Search
CPC ............. H10D 62/393; H10D 62/8325; H10D 62/8503; H10D 30/0281–0289; H10D 30/65–659; H10D 30/64–669; H10D 62/82; H10D 62/822; H10D 64/021; H01L 21/02529; H01L 21/0254
USPC ..................................... 257/77; 438/105, 931
See application file for complete search history.

(56) References Cited

U.S. PATENT DOCUMENTS

| | | | | | |
|---|---|---|---|---|---|
| 5,378,912 | A | * | 1/1995 | Pein ...................... | H10D 12/421 |
| | | | | | 257/E29.279 |
| 2010/0096697 | A1 | * | 4/2010 | Su ........................ | H10D 62/126 |
| | | | | | 257/343 |

(Continued)

*Primary Examiner* — Didarul A Mazumder
(74) *Attorney, Agent, or Firm* — Andrew R. Ralston; Frank D. Cimino

(57) ABSTRACT

The present disclosure generally relates to semiconductor devices including a material having a wide bandgap energy, or simply bandgap, located in a drift well of the semiconductor device. In an example, a semiconductor device includes a laterally-diffused metal-oxide-semiconductor (LDMOS) transistor. The LDMOS transistor includes a drain region, a source region, and a drift well. The drain region is disposed in a semiconductor material of a semiconductor substrate. The source region is disposed in the semiconductor material of the semiconductor substrate. The drift well is disposed laterally between the drain region and the source region. The drift well includes a wide bandgap material, and the wide bandgap material has a bandgap energy that is larger than a bandgap energy of the semiconductor material of the semiconductor substrate.

16 Claims, 16 Drawing Sheets

(56) References Cited

U.S. PATENT DOCUMENTS

2010/0127321 A1*  5/2010  Ko ..................... H10D 30/0221
                                                 257/E21.409
2012/0187419 A1*  7/2012  Elpelt ................. H10D 62/157
                                                 257/77

* cited by examiner

WIDE BANDGAP MATERIAL IN DRIFT WELL OF SEMICONDUCTOR DEVICE

BACKGROUND

Laterally-diffused metal-oxide-semiconductor (LDMOS) transistors are a type of double-diffused metal-oxide-semiconductor field effect transistor (MOSFET). LDMOS transistors are capable of being implemented in high voltage and/or high power applications. However, continued scaling of semiconductor device sizes to smaller and smaller dimensions raises challenges in LDMOS transistor manufacturing.

SUMMARY

This summary is provided to introduce a brief selection of disclosed concepts in a simplified form that are further described below in the detailed description including the drawings provided. Various disclosed devices and methods may be beneficially applied in the context of semiconductor devices including a material having a wide bandgap energy, or simply bandgap, located in a drift well of the semiconductor device. While such examples may be expected to allow increased breakdown voltage and/or reduced device size, no particular result is a requirement unless explicitly recited in a particular claim.

An example described herein is a semiconductor device. The semiconductor device includes a laterally-diffused metal-oxide-semiconductor (LDMOS) transistor. The LDMOS transistor includes a drain region, a source region, and a drift well. The drain region is disposed in a semiconductor material of a semiconductor substrate. The source region is disposed in the semiconductor material of the semiconductor substrate. The drift well is disposed laterally between the drain region and the source region. The drift well includes a wide bandgap material, and the wide bandgap material has a bandgap energy that is larger than a bandgap energy of the semiconductor material of the semiconductor substrate.

Another example is a method of forming a semiconductor device. A recess is etched in a semiconductor material of a semiconductor substrate. A wide bandgap material is formed in the recess. The wide bandgap material has a bandgap energy that is larger than a bandgap energy of the semiconductor material of the semiconductor substrate. A drift well including the wide bandgap material is formed. A drain region and a source region are formed each disposed in the semiconductor material of the semiconductor substrate. The drift well is at least partially disposed laterally between the source region and the drain region.

A further example is a semiconductor device. The semiconductor device includes an LDMOS transistor. The LDMOS transistor includes a gate electrode structure, a drain region, a source region, and a drift well. The gate electrode structure is disposed over a gate oxide layer and a local oxidation of silicon (LOCOS) structure. The drain region is disposed in a semiconductor material of a semiconductor substrate. The source region is disposed in the semiconductor material of the semiconductor substrate. The gate oxide layer and the LOCOS structure are disposed laterally between the drain region and the source region. The drift well is disposed, at least in part, laterally between the drain region and the source region. The drift well includes a wide bandgap material. The wide bandgap material is disposed underlying the LOCOS structure. The wide bandgap material has a bandgap energy that is larger than a bandgap energy of the semiconductor material of the semiconductor substrate.

The foregoing summary outlines rather broadly various features of examples of the present disclosure in order that the following detailed description may be better understood. Various features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
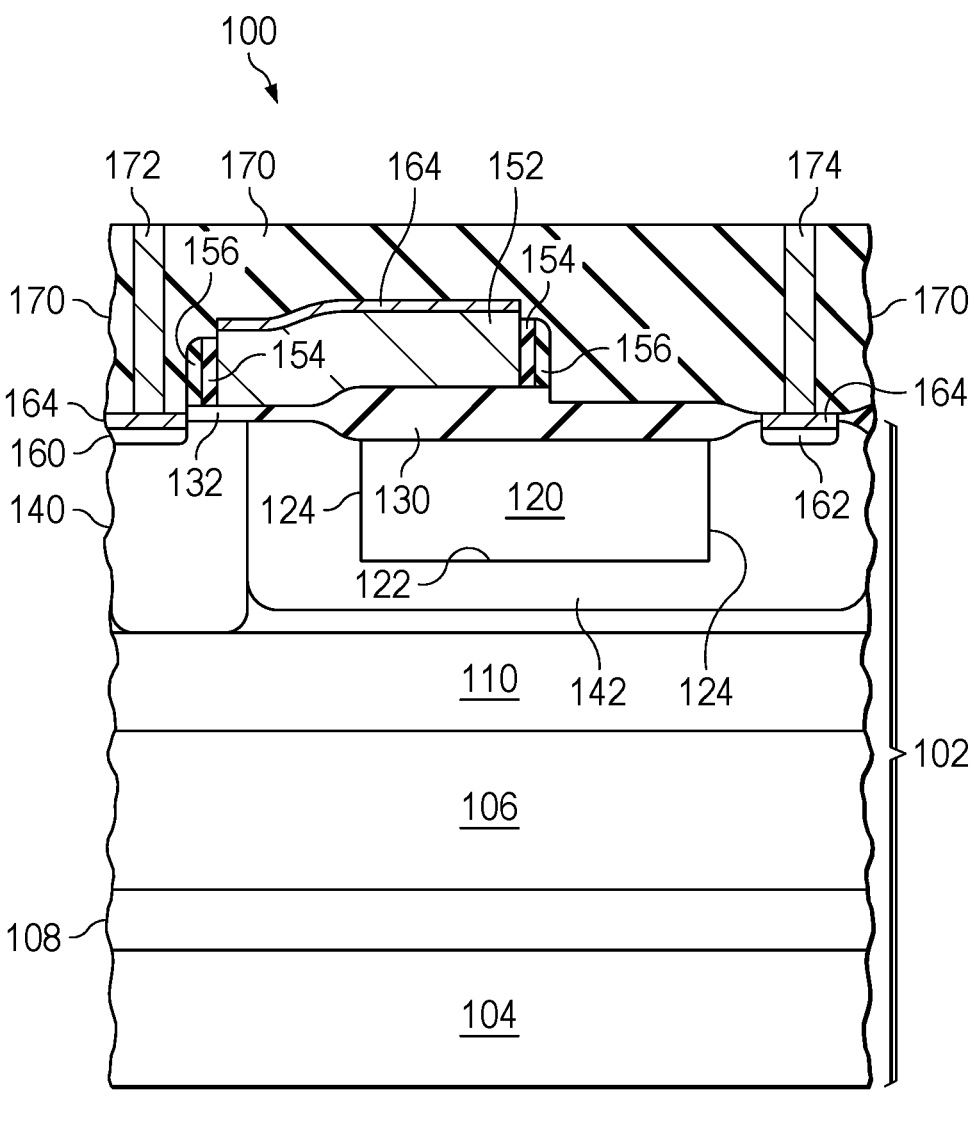
FIG. 1 is a cross-sectional view of a semiconductor device according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. In the following discussion, doping concentrations may be described in quantitative and/or qualitative terms, wherein a doping concentration less than $1 \times 10^{16}$ cm$^{-3}$ is lightly doped, a doping concentration between $1 \times 10^{16}$ cm$^{-3}$ and $1 \times 10^{18}$ cm 3 is moderately doped, a doping concentration between $1 \times 10^{18}$ cm$^{-3}$ and $1 \times 10^{20}$ cm$^{-3}$ is heavily doped, and a doping concentration above $1 \times 10^{20}$ cm$^{-3}$ is very heavily doped. A doping concentration at the boundaries of these ranges may be referred to qualitatively by either term referring to the higher or lower range.

The present disclosure relates generally, but not exclusively, to semiconductor devices including a material having a wide bandgap energy, or simply bandgap, located in a drift well of the semiconductor device. The semiconductor device may be or include a laterally-diffused metal-oxide-semiconductor (LDMOS) transistor, although other semiconductor devices may benefit from aspects described herein. A semiconductor device that includes a wide bandgap material in a drift well may achieve a higher breakdown voltage and/or voltage blocking capability for a given device size (e.g., drift length), may achieve a smaller device size for a given breakdown voltage and/or voltage blocking capability, or may achieve a combination of higher breakdown voltage and/or voltage blocking capability and smaller device size. Some examples described herein provide for a method to manufacture a semiconductor device in which no additional lithography masks are implemented for the formation of the wide bandgap material. Other examples may implement additional masks. While such examples may be expected to allow increased breakdown voltage and/or reduced device size, no particular result is a requirement of the present invention unless explicitly recited in a particular claim.

Further, some examples include a semiconductor device that includes at least two devices (e.g., at least two LDMOS transistors), where at least one device includes a wide bandgap material in a drift well, and at least one device does not include a wide bandgap material in a drift well. In such a semiconductor device, devices of different operating voltages (e.g., one a high voltage and another a low voltage) may be implemented. Some examples described herein provide for a method to manufacture a semiconductor device of such at least two devices. In the method, one additional lithography mask may be implemented for the formation of the devices. Other benefits and advantages may be achieved.

FIG. 1 is a cross-sectional view of a semiconductor device 100 according to some examples. The semiconductor device 100, in this example, is or includes an LDMOS transistor. The LDMOS transistor of the semiconductor device 100 of FIG. 1 is described below as an n-channel LDMOS transistor. In other examples, the LDMOS transistor may be a p-channel LDMOS transistor. Some aspects of the semiconductor device 100 are shown generically so as to not obscure aspects described herein. An LDMOS transistor may include additional regions or components not described herein. Additionally, an LDMOS transistor may be in a number of different configurations, and the LDMOS transistor shown in FIG. 1 is merely an example to illustrate various aspects described herein.

The semiconductor device 100 includes a semiconductor substrate 102. The semiconductor substrate 102, in the illustrated example, includes a semiconductor support (or handle) substrate 104 (or handle wafer) and an epitaxial layer 106. The semiconductor support substrate 104 may be a bulk semiconductor substrate, a semiconductor-on-insulator (SOI) substrate, or any other appropriate substrate. The epitaxial layer 106 is epitaxially grown over (e.g., possibly, on) the semiconductor support substrate 104. The epitaxial layer 106 may be or include silicon (Si), silicon germanium (SiGe), gallium arsenide (GaAs), gallium nitride (GaN), the like, or a combination thereof. In some examples, the semiconductor support substrate 104 is or includes a silicon substrate (which may be singulated from a bulk silicon wafer at the conclusion of semiconductor processing), and the epitaxial layer 106 is or includes a layer of silicon. In some examples, the epitaxial layer 106 may be omitted, and a semiconductor material of the semiconductor substrate 102 (e.g., in or on which devices are formed) may be or include silicon (Si), silicon germanium (SiGe), gallium arsenide (GaAs), the like, or a combination thereof. The semiconductor substrate 102 has a top major surface in and/or on which devices (e.g., transistors) are generally disposed and formed.

A deep buried layer 108 is disposed in the semiconductor support substrate 104. The deep buried layer 108 extends from an interface between the semiconductor support substrate 104 and the epitaxial layer 106 to a depth in the semiconductor support substrate 104. The deep buried layer 108 includes a portion of the semiconductor support substrate 104 doped by a dopant. In the n-channel LDMOS transistor, the deep buried layer 108 may be an n-type layer doped with an n-type dopant (e.g., phosphorous and/or arsenic) at a concentration in a range from about $1 \times 10^{17}$ cm$^{-3}$ to about $8 \times 10^{18}$ cm$^{-3}$, e.g., moderately to heavily doped.

The epitaxial layer 106 is doped with a dopant. The dopant with which the epitaxial layer 106 is doped has a conductivity type that is counter (e.g., opposite from) the conductivity type of the dopant with which the deep buried layer 108 is doped. In the n-channel LDMOS transistor, the epitaxial layer 106 may be p-doped in situ with a p-type dopant (e.g., boron) at a concentration in a range from about $1 \times 10^{14}$ cm$^{-3}$ to about $5 \times 10^{15}$ cm$^{-3}$, e.g., lightly doped.

As mentioned, in some examples, the epitaxial layer 106 may be omitted. In such examples, the deep buried layer 108 may be implanted at a depth in the semiconductor substrate 102, and a well may be implanted in the semiconductor substrate 102 extending from a top major surface of the semiconductor substrate 102 to a depth to or above the deep buried layer 108. The well may be counter-doped from the deep buried layer 108 like described with respect to the epitaxial layer 106.

A buried layer 110 is disposed in the semiconductor substrate 102 (e.g., in the epitaxial layer 106, as illustrated). The buried layer 110 is disposed over the deep buried layer 108. The buried layer 110 is doped with a dopant that has a conductivity type that is the same as the conductivity type of the dopant with which the epitaxial layer 106 is doped and that is counter the conductivity type of the dopant with which the deep buried layer 108 is doped. In the n-channel LDMOS transistor, the deep buried layer 108 may be a p-layer doped with a p-type dopant at a concentration in a range from about $1 \times 10^{17}$ cm$^{-3}$ to about $2 \times 10^{20}$ cm$^{-3}$, e.g., moderately to very heavily doped.

A dielectric isolation structure 130 is disposed over the semiconductor substrate 102 (e.g., on or over the epitaxial layer 106, as illustrated). The dielectric isolation structure 130 may be or include any appropriate dielectric or isolation material. In some examples, the dielectric isolation structure 130 is a field oxide region, such as a local oxidation of silicon (LOCOS) structure, and in other examples, the dielectric isolation structure 130 may be another dielectric isolation structure, such as a shallow trench isolation (STI).

A gate dielectric layer 132 extends laterally from the dielectric isolation structure 130. The gate dielectric layer 132 may be or include any appropriate dielectric material, such as an oxide, nitride, the like, or a combination thereof. For example, the gate dielectric layer 132 may be a gate oxide layer.

A wide bandgap material 120 is disposed in the semiconductor substrate 102 (e.g., in the epitaxial layer 106) and underlying the dielectric isolation structure 130. The wide bandgap material 120 may be any material that has a bandgap energy greater than that of the semiconductor material of the semiconductor substrate 102 (e.g., the semiconductor material of the epitaxial layer 106). In some examples, the substrate 102 (or epitaxial layer 106) is composed substantially of silicon (Si), which has a bandgap energy of 1.12 electron volt (eV). In some examples, a wide bandgap material 120 has a bandgap greater than 1.5 eV, and more particularly, equal to or greater than 2 eV. In some examples, the wide bandgap material 120 is or includes silicon carbide (SiC), gallium nitride (GaN), aluminum arsenide (AlAs), the like, or a combination thereof. The wide bandgap material 120 is disposed in a recess in the semiconductor substrate 102 and has a bottom surface 122 and vertical linear sidewall surfaces 124 that interface with (e.g., adjoin) the semiconductor substrate 102 (e.g., the epitaxial layer 106).

A drift well 142 is disposed in the semiconductor substrate 102 (e.g., in the epitaxial layer 106, as illustrated). The drift well 142 extends from the top major surface of the semiconductor substrate 102 into a depth in the semiconductor substrate 102. A bottom depth of the drift well 142, as illustrated, is above the buried layer 110, and in other examples, the bottom depth of the drift well 142 may be to or at the buried layer 110. The bottom surface 122 of the wide bandgap material 120, as illustrated, is in the drift well 142. In other examples, the bottom surface 122 of the wide bandgap material 120 may be at or below the bottom depth of the drift well 142. Hence, in some examples, the wide bandgap material 120 may extend vertically partially or wholly through the drift well 142. The dielectric isolation structure 130 is disposed overlying and laterally within the drift well 142. The drift well 142 extends laterally underlying at least a portion of the gate dielectric layer 132. The drift well 142 is doped with a dopant. The dopant with which the drift well 142 is doped has a conductivity type that is counter the conductivity type of the dopant with which the epitaxial layer 106 and the buried layer 110 are doped. In the n-channel LDMOS transistor, the drift well 142 may be an n-well doped with an n-type dopant at a concentration in a range from about $1 \times 10^{16}$ cm$^{-3}$ to about $5 \times 10^{17}$ cm$^{-3}$, e.g., moderately doped.

A gate electrode 152 is disposed over the gate dielectric layer 132 and a portion of the dielectric isolation structure 130 proximate to the gate dielectric layer 132. The gate electrode 152 may be or include any appropriate conductive material, such as polysilicon (e.g., doped polysilicon), metal (e.g., tungsten (W), aluminum (Al), titanium (Ti), tantalum (Ta), or the like), the like, or a combination thereof. Oxide layers 154 are disposed along sidewall surfaces of the gate electrode 152, and spacers 156 are disposed on the oxide layers 154 disposed along sidewall surfaces of the gate electrode 152. The spacers 156 may be or include any appropriate dielectric material, such as an oxide, a nitride, the like, or a combination thereof.

A diffusion well (Dwell) 140 is disposed in the semiconductor substrate 102 (e.g., in the epitaxial layer 106, as illustrated). The Dwell 140 extends from the top major surface of the semiconductor substrate 102 to a depth in the semiconductor substrate 102 to the buried layer 110. The Dwell 140 is disposed at least partially underlying the gate dielectric layer 132 that extends from the dielectric isolation structure 130. As illustrated, the Dwell 140 neighbors (e.g., adjoins) the drift well 142. The Dwell 140 is doped with a dopant that has a conductivity type that is a same conductivity type as the dopant with which the buried layer 110 and epitaxial layer 106 are doped and that is counter the conductivity type of the dopants with which the drift well 142 is doped. In the n-channel LDMOS transistor, the Dwell 140 may be p-doped with a p-type dopant at a concentration in a range from about $1 \times 10^{18}$ cm$^{-3}$ to about $1 \times 10^{19}$ cm$^{-3}$, e.g., heavily doped.

A source region 160 is disposed in the Dwell 140 extending from the top major surface of the semiconductor substrate 102 to a depth in the Dwell 140 in the semiconductor substrate 102. The source region 160 is laterally proximate to and extends from the gate dielectric layer 132. The source region 160 is doped with a dopant having an opposite conductivity type as the dopant with which the Dwell 140 is doped. In the n-channel LDMOS transistor, the source region 160 may be n-doped with an n-type dopant at a concentration in a range from about $1 \times 10^{20}$ cm$^{-3}$ to about $3 \times 10^{21}$ cm$^{-3}$, e.g., very heavily doped.

A drain region 162 is disposed in the drift well 142 extending from the top major surface of the semiconductor substrate 102 to a depth in the drift well 142 in the semiconductor substrate 102. The gate dielectric layer 132 and the dielectric isolation structure 130 (from which the gate dielectric layer 132 extends) are disposed laterally between the source region 160 and the drain region 162. The drain region 162 is laterally disposed a greater distance from the gate electrode 152 than the distance the source region 160 is disposed from the gate electrode 152. The drain region 162 is doped with a dopant having a conductivity type that is the same as the dopants with which the source region 160 and the drift well 142 are doped. In the n-channel LDMOS transistor, the drain region 162 may be n-doped with an n-type dopant at a concentration in a range from about $1 \times 10^{20}$ cm$^{-3}$ to about $3 \times 10^{21}$ cm$^{-3}$, e.g., very heavily doped.

Semiconductor-metal compound regions 164 are disposed on respective regions at the top major surface of the semiconductor substrate 102 and on a top surface of the gate electrode 152. Such semiconductor-metal compound regions may sometimes be referred to a metal-silicide regions (for a silicon substrate), or simply silicide regions. A semiconductor-metal compound region 164 is disposed on the source region 160 at the top major surface of the semiconductor substrate 102. A semiconductor-metal compound region 164 is disposed on the drain region 162 at the top major surface of the semiconductor substrate 102. A semiconductor-metal compound region 164 is disposed on the top surface of the gate electrode 152. In some examples, the semiconductor-metal compound regions 164 may be a silicide, such as when the epitaxial layer 106 and gate electrode 152 is or includes silicon (Si). A metal of the semiconductor-metal compound regions 164 may be or include nickel (Ni), tungsten (W), molybdenum (Mo), titanium (Ti), magnesium (Mg), the like, or a combination thereof.

A dielectric layer 170 is disposed over the semiconductor substrate 102. Such a dielectric layer is sometimes referred to as a pre-metal dielectric layer. More specifically, the dielectric layer 170 is disposed over (e.g., possibly, on) a portion of the dielectric isolation structure 130 not underlying the gate electrode 152, semiconductor-metal compound regions 164, and spacers 156. The dielectric layer 170 may include multiple dielectric layers. For example, the dielectric layer 170 may include an etch stop layer (e.g., silicon nitride (SiN) or the like) disposed conformally along surfaces of, e.g., the portion of the dielectric isolation structure 130 not underlying the gate electrode 152, the semiconductor-metal compound regions 164, and the spacers 156, and may include an inter-layer dielectric (e.g., an oxide or the like) disposed over the etch stop layer.

A source contact 172 is disposed through the dielectric layer 170 and contacts the semiconductor-metal compound region 164 disposed on the source region 160. A drain contact 174 is disposed through the dielectric layer 170 and contacts the semiconductor-metal compound region 164 disposed on the drain region 162. The source contact 172 and the drain contact 174 may include one or more barrier and/or adhesion layers (e.g., titanium nitride (TiN), tantalum nitride (TaN), the like, or a combination thereof) conformally in a respective opening through the dielectric layer 170, and may include a conductive fill material (e.g., a metal, such as tungsten (W), copper (Cu), a combination thereof, or the like).

As noted above, the LDMOS transistor illustrated in FIG. 1 is an example. Other LDMOS transistor structures incorporating aspects described herein may be implemented.

Figure 2:
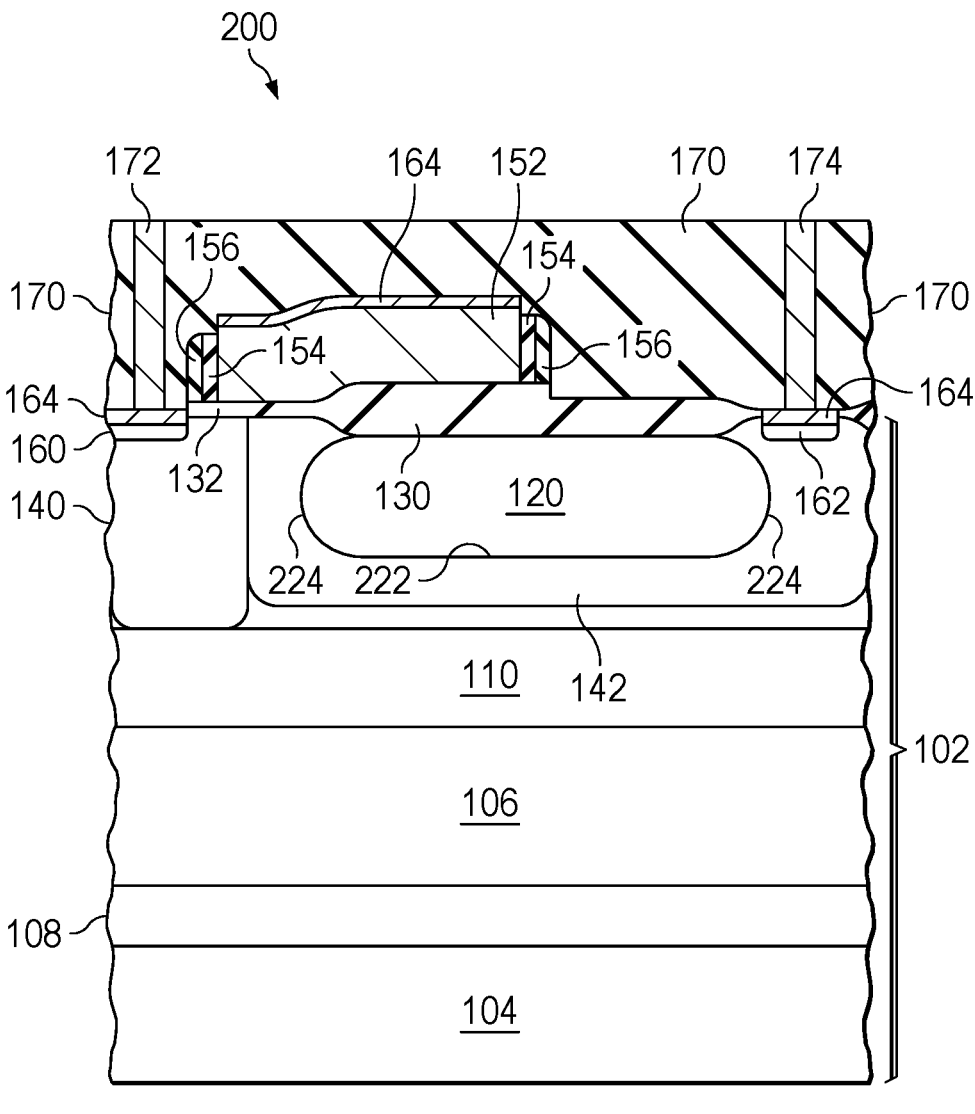
FIG. 2 is a cross-sectional view of a semiconductor device according to some examples.

FIG. 2 is a cross-sectional view of a semiconductor device 200 according to some examples. The semiconductor device 200, in this example, is or includes an LDMOS transistor. The LDMOS transistor of the semiconductor device 200 of FIG. 2 may be an n-channel LDMOS transistor. In other examples, the LDMOS transistor may be a p-channel LDMOS transistor. Like in FIG. 1, some aspects of the semiconductor device 200 are shown generically and simplistically.

The semiconductor device 200 of FIG. 2 is like the semiconductor device 100 of FIG. 1, except the wide bandgap material 120 in the semiconductor substrate 102 has a bottom surface 222 and vertical curved sidewall surfaces 224. The wide bandgap material 120 is disposed in a recess in the semiconductor substrate 102 and has the bottom surface 222 and the vertical curved sidewall surfaces 224 that interface (e.g., adjoin) the semiconductor substrate 102 (e.g., the epitaxial layer 106).

Figure 3:
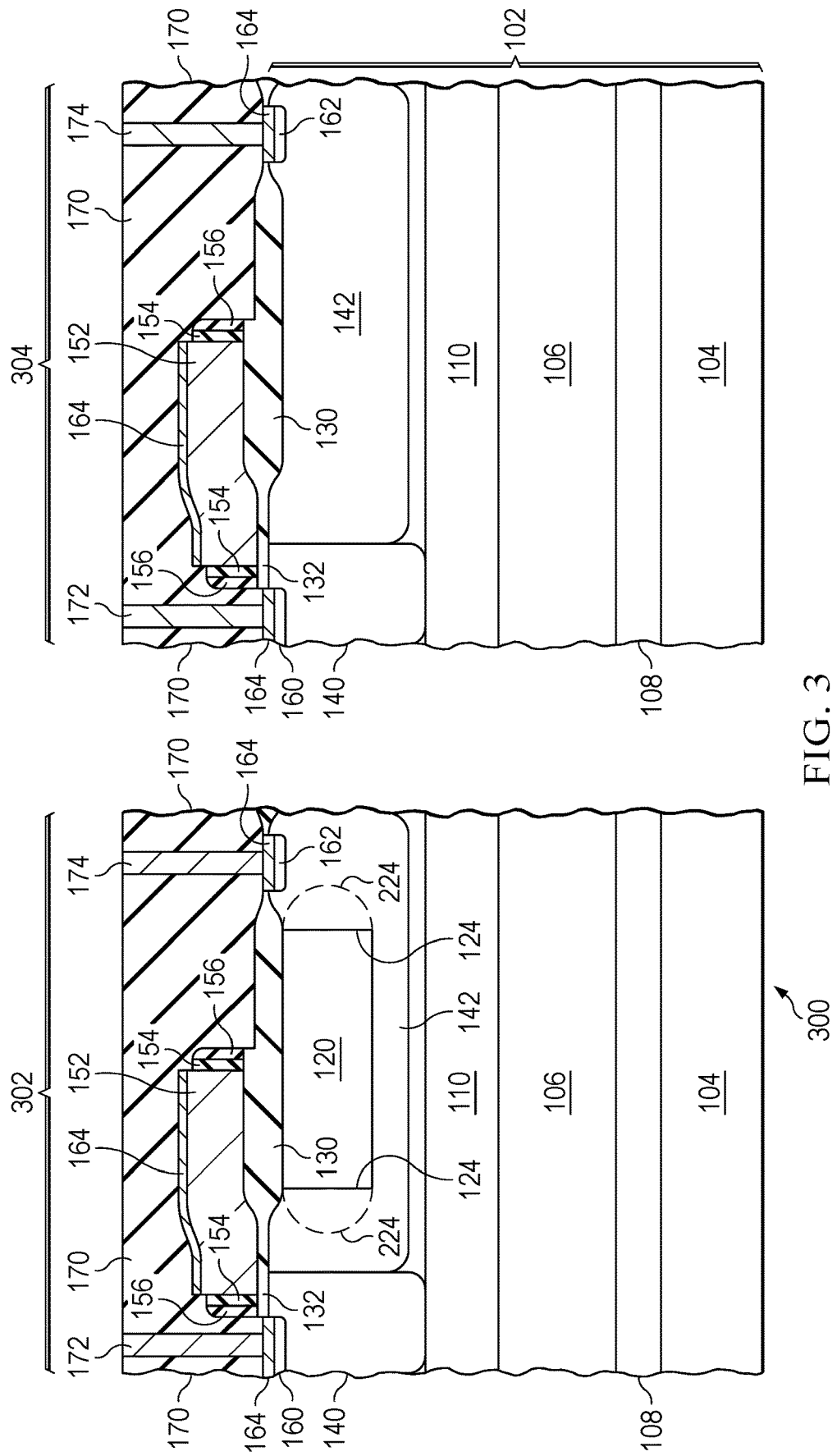
FIG. 3 is a cross-sectional view of a semiconductor device according to some examples.

FIG. 3 is a cross-sectional view of a semiconductor device 300 according to some examples. The semiconductor device 300, in this example, is or includes a first LDMOS transistor in a first region 302 of the semiconductor substrate 102 and a second LDMOS transistor in a second region 304 of the semiconductor substrate 102. The LDMOS transistors of the semiconductor device 300 of FIG. 3 may be n-channel LDMOS transistors. In other examples, the LDMOS transistors may be p-channel LDMOS transistors, or one LDMOS transistor may be an n-channel LDMOS transistor while the other is a p-channel LDMOS transistor. Like in previous figures, some aspects of the semiconductor device 300 are shown generically and simplistically.

The semiconductor device 300 of FIG. 3, in the first region 302 of the semiconductor substrate 102, includes the semiconductor device 100 of FIG. 1 or the semiconductor device 200 of FIG. 2. While the vertical linear sidewall surfaces 124 of the wide bandgap material 120 of FIG. 1 are explicitly shown in FIG. 3, the vertical curved sidewall surfaces 224 of the wide bandgap material 120 of FIG. 2 are shown by dashed lines. The semiconductor device 300 of FIG. 3, in the second region 304, includes a semiconductor device like the semiconductor device 100, 200 of FIG. 1 or 2, except the semiconductor device in the second region 304 does not include a wide bandgap material in the drift well 142. The semiconductor device 300, as illustrated, includes a first LDMOS transistor (in the first region 302) that includes a wide bandgap material 120 in the drift well 142 and includes a second LDMOS transistor (in the second region 304) that does not include a wide bandgap material 120 in the drift well 142.

In FIGS. 1 through 3, the wide bandgap material 120 in the drift well 142 may permit a higher breakdown voltage and/or higher voltage blocking capability of the respective semiconductor device (e.g., LDMOS transistor) in which the wide bandgap material 120 is formed. For example, given a same device size (e.g., for a given drift length of an LDMOS transistor) and same process integration, a semiconductor device with the wide bandgap material 120 as described may achieve an increase in breakdown voltage (Bvdss) of equal to or greater than 30%, such as from 30% to 40%. An increase in breakdown voltage and/or voltage blocking capability may permit a device to be implemented for an even higher voltage application, such as a high voltage power application. Conversely, the device size may be reduced while achieving a same breakdown voltage and/or voltage blocking capability. Reducing the device size may permit a smaller die size, which may permit more dies to be fabricated from a wafer. More dies being fabricated from a wafer may reduce an average cost for a die. Any permutation of decreased size and increased breakdown voltage and/or voltage blocking capability may be achieved. Further, including devices—at least one device with a wide bandgap material 120 and another at least one without a wide bandgap material, like in FIG. 3—may permit devices with different uses to be implemented on a same die. For example, a device with a wide bandgap material 120 may be implemented on a die for a high voltage application, whereas a device without a wide bandgap material may be implemented on the die for a lower voltage application. The wide bandgap material 120 permits more flexibility to achieve potentially different goals for a device.

Figure 4A:
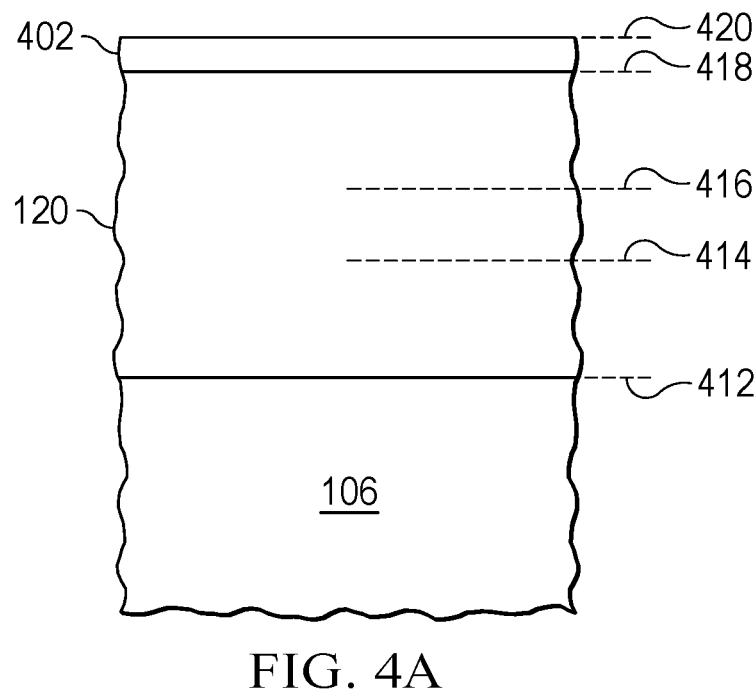
FIGS. 4A and 4B illustrate aspects of forming a wide bandgap material according to some examples.
Figure 4B:
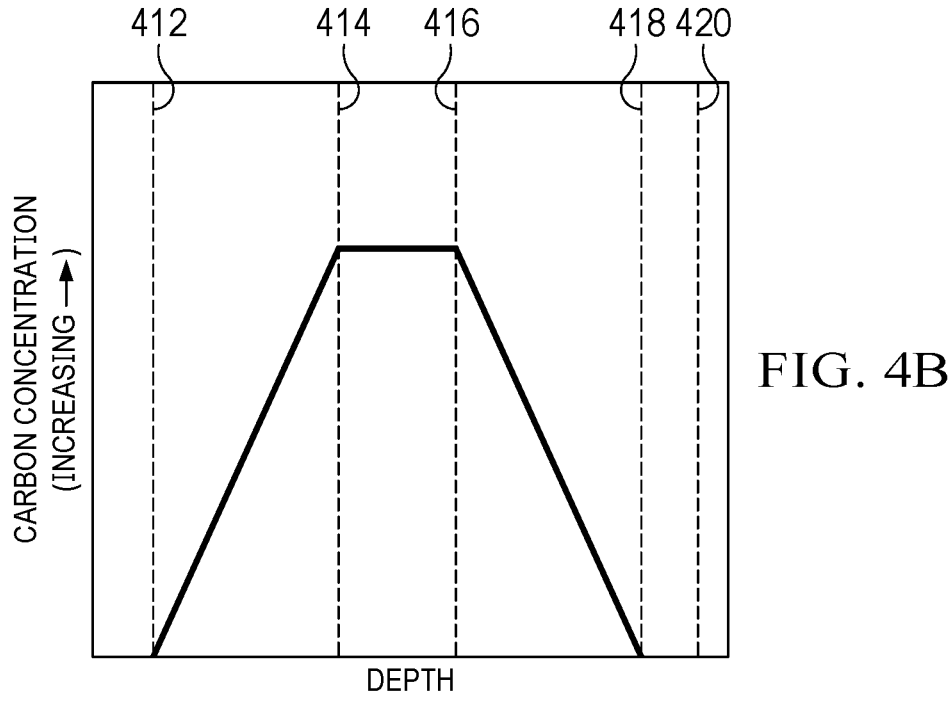

FIGS. 4A and 4B illustrate aspects of forming a wide bandgap material 120 according to some examples. In this example, the wide bandgap material 120 includes silicon carbide (SiC), although aspects of this example may apply to other wide bandgap materials. The silicon carbide is epitaxially grown on the semiconductor substrate 102 (e.g., the epitaxial layer 106), and a silicon layer 402 is epitaxially grown on the silicon carbide. As described subsequently, the silicon layer 402 is implemented as a source of silicon for oxidation to form a dielectric isolation structure (e.g., the dielectric isolation structure 130), and hence, may be referred to as a sacrificial layer. In other examples, the silicon layer 402 may be omitted, such as when the dielectric isolation structure is formed by another technique.

The silicon carbide is epitaxially grown starting with a low concentration of carbon or no carbon and subsequently increasing the concentration of carbon. As shown in FIGS. 4A and 4B, the carbon concentration at depth 412 (e.g., an interface between the epitaxial layer 106 and the wide bandgap material 120) is low or zero and increases to a peak concentration at depth 414. The peak concentration is maintained from depth 414 to depth 416. Then, the silicon carbide is epitaxially grown decreasing the concentration of carbon. The carbon concentration decreases from depth 416 to depth 418, at which point a low amount of or no carbon is present. The carbon concentration may be varied by varying a flow rate of a carbon-source precursor during the epitaxial growth of the silicon carbide. For example, the flow rate of the carbon-source precursor may be increased to obtain the increase in carbon concentration from depth 412 to depth 414, may be maintained to obtain the peak carbon concentration from depth 414 to depth 416, and may be decreased to obtain the decrease in carbon concentration from depth 416 to depth 418. The epitaxial growth may continue without the carbon-source precursor to obtain the silicon layer 402 from depth 418 to depth 420. The varying carbon concentration in FIGS. 4A and 4B may accommodate for lattice mismatch between the semiconductor substrate 102 (e.g., the epitaxial layer 106) and the silicon carbide (SiC) of the wide bandgap material 120 and between the silicon carbide (SiC) of the wide bandgap material 120 and the silicon layer 402.

FIGS. 5 through 13 illustrate cross-sectional views of the semiconductor device 100 of FIG. 1 at various stages of manufacturing according to an example method. The method illustrated by FIGS. 5 through 13 may be modified to implement the semiconductor device 200 of FIG. 2. Such modifications are described subsequently.

Figure 5:
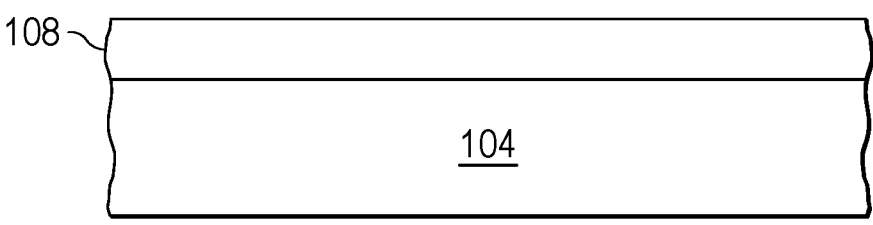
FIGS. 5, 6, 7, 8, 9, 10, 11, 12, and 13 are cross-sectional views of the semiconductor device of FIG. 1 or FIG. 2 at various stages of manufacturing according to some examples.

Referring to FIG. 5, a deep buried layer 108 is formed in a semiconductor support substrate 104. The deep buried layer 108 may be formed by implanting dopants into the semiconductor support substrate 104. In an example, the semiconductor support substrate 104 is a bulk silicon wafer. The dopant type and concentration of the deep buried layer 108 are as described above.

Figure 6:
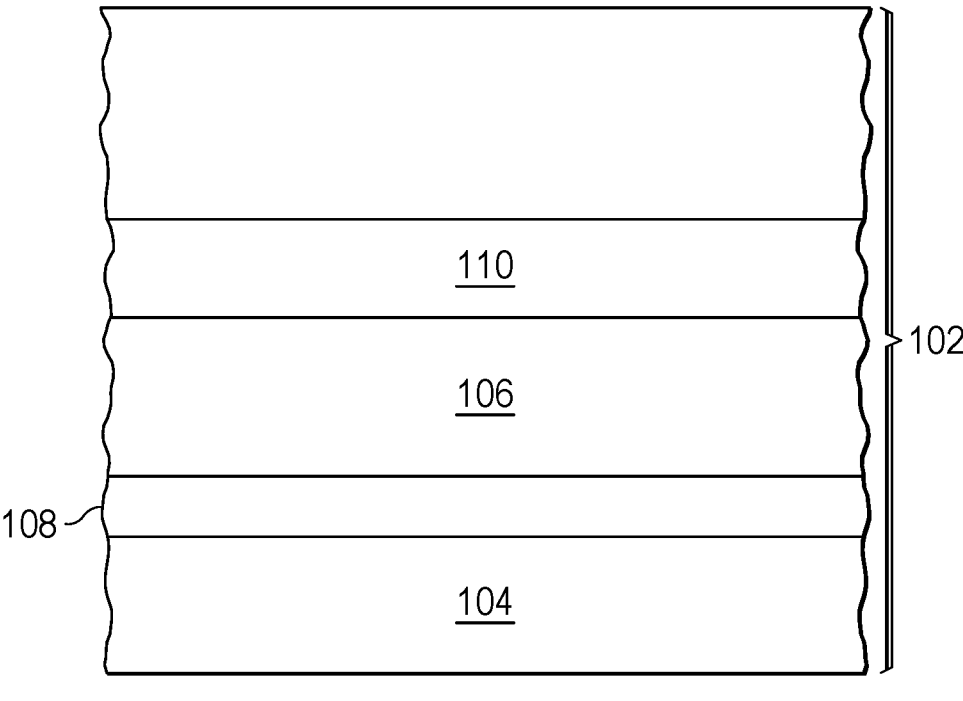

Referring to FIG. 6, an epitaxial layer 106 is formed over the semiconductor support substrate 104. The epitaxial layer 106 may be formed using an epitaxial growth by an appropriate epitaxial growth process, such as low pressure chemical vapor deposition (LPCVD) or the like. In an example, the epitaxial layer 106 is silicon. The epitaxial layer 106 is doped, such as by in situ doping during the epitaxial growth. The dopant type and concentration of the epitaxial layer 106 are as described above. Further, a buried layer 110 is formed in the semiconductor substrate 102 (e.g., in the epitaxial layer 106). The buried layer 110 may be formed by implanting dopants into the epitaxial layer 106. The dopant type and concentration of the buried layer 110 are as described above.

In the illustrated example, the semiconductor support substrate 104 and the epitaxial layer 106 form a semiconductor substrate 102. In other examples, another semiconductor substrate may be used. For example, the semiconductor substrate 102 may be a bulk silicon wafer (e.g., without the epitaxial layer 106) with the deep buried layer 108 implanted to a deep depth in the semiconductor substrate 102 and a doped well implanted with a dopant type and concentration like the epitaxial layer 106.

Figure 7:
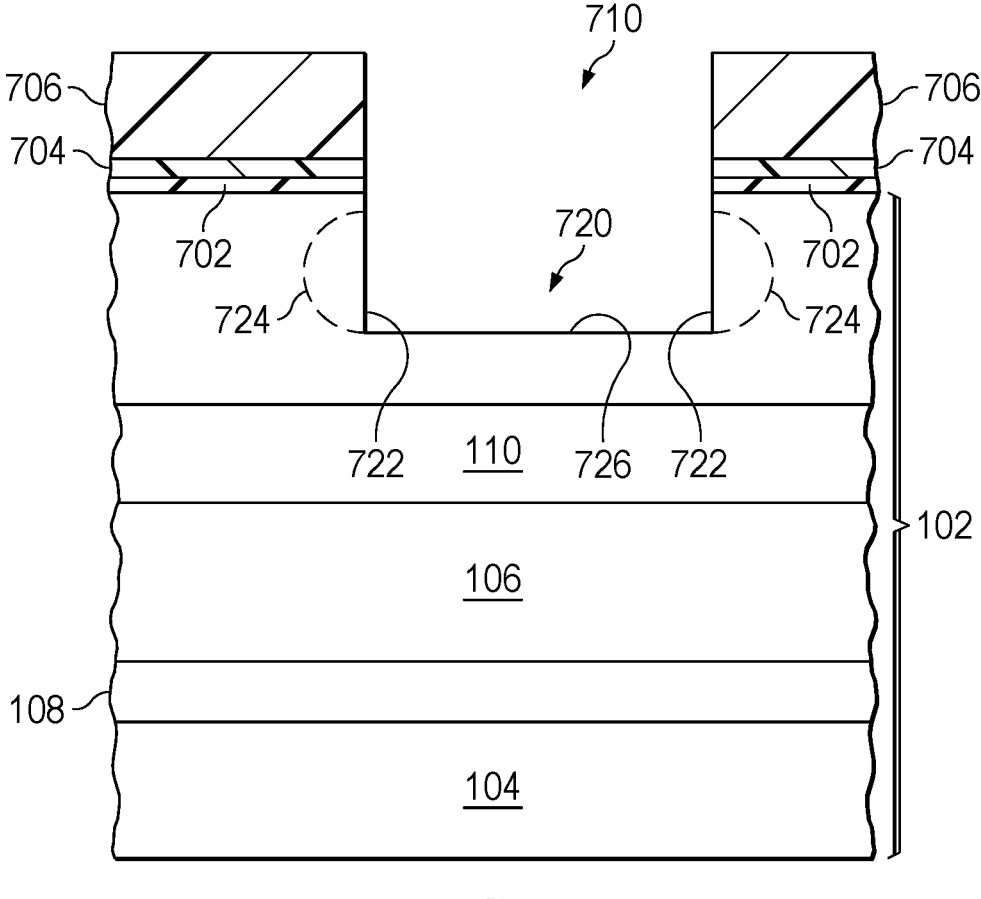

Referring to FIG. 7, a pad oxide layer 702 is formed over a top major surface of the semiconductor substrate 102. In some examples, the pad oxide layer 702 is formed by performing an oxidation process to oxide the semiconductor material (e.g., silicon) at the top major surface of the semiconductor substrate 102. Hence, in such examples, the pad oxide layer 702 may be an oxide of the semiconductor material of the semiconductor substrate, such as silicon oxide. In other examples, the pad oxide layer 702 may be deposited over the semiconductor substrate 102 using an appropriate deposition process, such as, for example, chemical vapor deposition (CVD), physical vapor deposition (PVD), atomic layer deposition (ALD), or the like. A mask layer 704 is formed over the pad oxide layer 702. In some examples, the mask layer 704 is a nitride, such as silicon nitride. The mask layer 704 may be deposited by any appropriate deposition process, such as CVD, PVD, ALD, or the like.

A photoresist 706 is formed over the mask layer 704. The photoresist 706 may be deposited by spin-on and patterned using photolithography. The photoresist 706 has an opening 710 therethrough that, when formed, exposes the mask layer 704. With the photoresist 706 patterned with the opening 710, an etch process is performed to remove respective portions of the mask layer 704 and the pad oxide layer 702 that align with the opening 710. The etch process to remove the portions of the mask layer 704 and the pad oxide layer 702 may be an anisotropic etch and/or an isotropic etch. Removing the portions of the mask layer 704 and the pad oxide layer 702 exposes a portion of the top major surface of the semiconductor substrate 102 that will be etched to form a recess in the semiconductor substrate 102.

Subsequently, the semiconductor substrate 102 is etched using the mask layer 704 and/or photoresist 706 as a mask. The etching of the semiconductor substrate 102 forms a recess 720 in the semiconductor substrate 102. In some examples, the etching of the semiconductor substrate 102 is an anisotropic etch, such as a dry etch, like a reactive ion etch (RIE). As illustrated, an anisotropic etch may result in vertical linear sidewall surfaces 722 of the recess 720. In some examples, the etching of the semiconductor substrate 102 is an isotropic etch, which may be a wet etch and/or a dry etch. An isotropic etch may result in vertical curved sidewall surfaces 724 (shown by dashed lines) of the recess 720. The recess 720 has a bottom surface 726 that meets the vertical linear sidewall surfaces 722 (or vertical curved sidewall surfaces 724). The bottom surface 726 is at a depth in the epitaxial layer 106 over the buried layer 110. In some examples, the bottom surface 726 is at a depth at, in, or below the buried layer 110. Following the etching of the semiconductor substrate 102, any remaining photoresist 706 is removed, such as by ashing.

Figure 8:
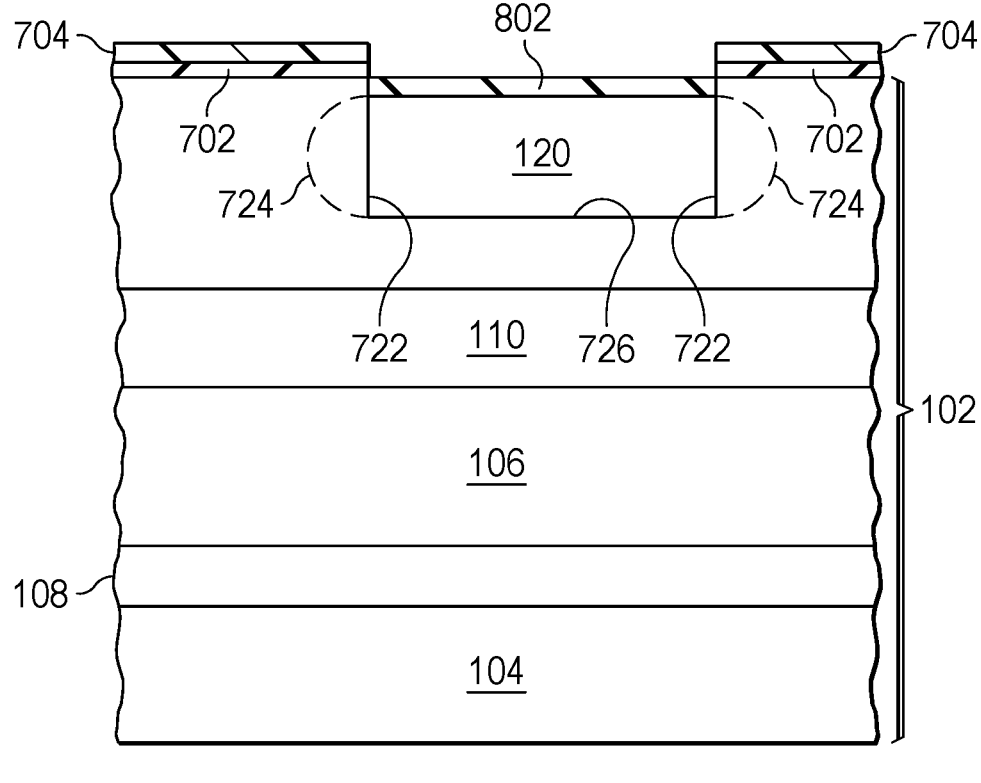

Referring to FIG. 8, a wide bandgap material 120 and a silicon layer 802 are epitaxially grown in the recess 720. The wide bandgap material 120 is epitaxially grown on the bottom surface 726 of the recess 720, and subsequently, the silicon layer 802 is epitaxially grown on the wide bandgap material 120. The wide bandgap material 120 and silicon layer 802 may be epitaxially grown by any appropriate epitaxial growth process, such as LPCVD, molecular beam epitaxy (MBE), metalorganic vapor phase epitaxy (MOVPE), or the like. The wide bandgap material 120 and silicon layer 802 adjoin the vertical linear sidewall surfaces 722 (or vertical curved sidewall surfaces 724) of the recess 720. For clarity, the subsequently described processing may be performed regardless of the etching process implemented to form the recess 720 (and hence, whether the sidewalls are vertical linear sidewall surfaces 722 or vertical curved sidewall surfaces 724). Illustration of the vertical curved sidewall surfaces 724 in subsequently described figures is omitted to avoid obscuring other aspects.

The epitaxial growth of the wide bandgap material 120 and the silicon layer 802 may be as described above with respect to FIGS. 4A and 4B. In some examples, the wide bandgap material 120 may be silicon carbide (SiC), gallium nitride (GaN), aluminum arsenide (AlAs), the like, or a combination thereof. The wide bandgap material 120 may be epitaxially grown with one or more varying or gradient concentrations of types of atoms in the wide bandgap material 120, such as to accommodate lattice mismatch between the semiconductor substrate 102 (e.g., the epitaxial layer 106) and the wide bandgap material 120.

A top surface of the silicon layer 802 is at or above the top major surface of the semiconductor substrate 102, in some examples. A thickness of the silicon layer 802 may be sufficient to be oxidized to form a target field oxide, such as a LOCOS structure. In some examples, a thickness of the silicon layer 802 may be in a range from 100 nm to 1,000 nm.

Figure 9:
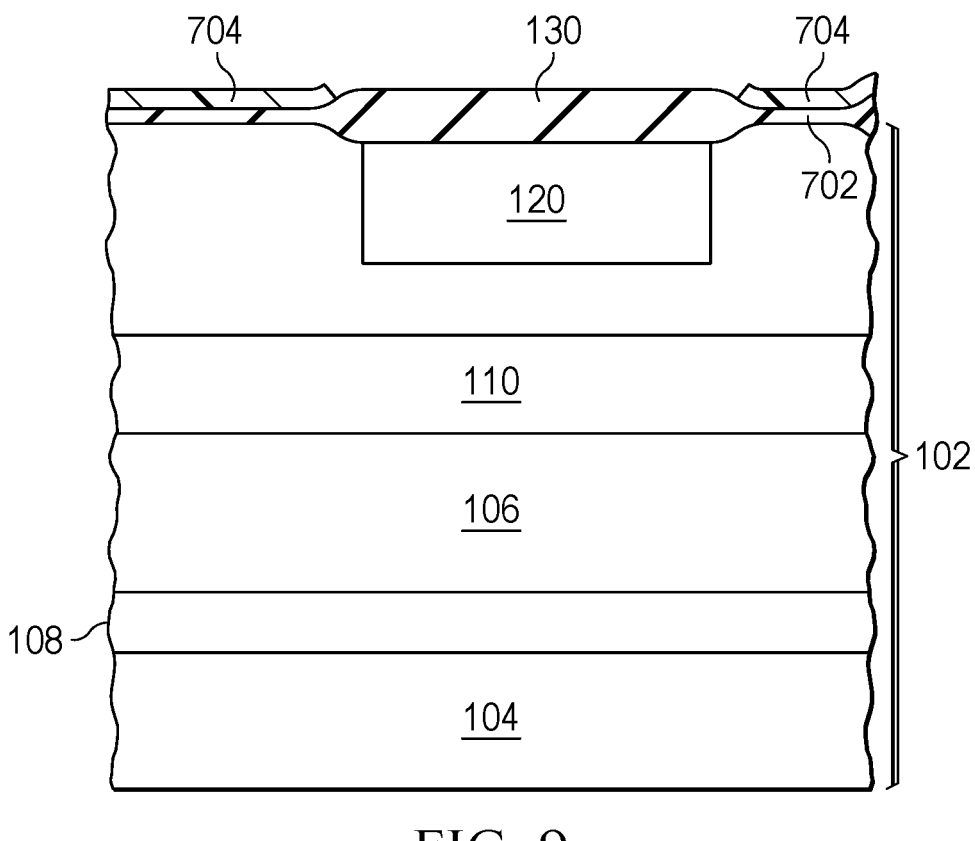

Referring to FIG. 9, an oxidation process is performed to form the dielectric isolation structure 130. The oxidation process oxidizes the silicon layer 802 exposed through the mask layer 704, and hence, the silicon layer 802 may be a sacrificial layer for the oxidation process. The oxidation process may further laterally penetrate under the mask layer 704 from the opening to oxide the semiconductor material (e.g., silicon) at the top major surface of the semiconductor substrate 102. Generally, an opening through the mask layer 704 allows vertical penetration and diffusion of oxygen such that oxidation of the silicon layer 802 occurs at the opening. The presence of the mask layer 704 generally inhibits or reduces vertical penetration and diffusion of oxygen in areas covered by the mask layer 704. However, oxygen may diffuse laterally from the opening to oxidize portions of the semiconductor substrate 102 (e.g., the epitaxial layer 106) at edges of the opening and underlying the mask layer 704. This lateral diffusion and resulting oxidation forms, at least in part, bird's beak regions of the dielectric isolation structure 130. In some examples, the oxidation process may include a thermal oxidation performed at an elevated temperature while flowing a gas comprising oxygen ($O_2$), ozone ($O_3$), steam ($H_2O$), the like, or a combination thereof. The oxidation process may be referred to as LOCOS.

As illustrated by the processing of FIGS. 7 through 9, the wide bandgap material 120 may be formed in the semiconductor substrate 102 using the photolithography processing (e.g., to form the photoresist 706) used to form the dielectric isolation structure 130. Hence, incorporating the wide bandgap material 120 according to some examples may not require use of an additional photolithography process, and hence, an additional lithography mask, to form the semiconductor device.

Figure 10:
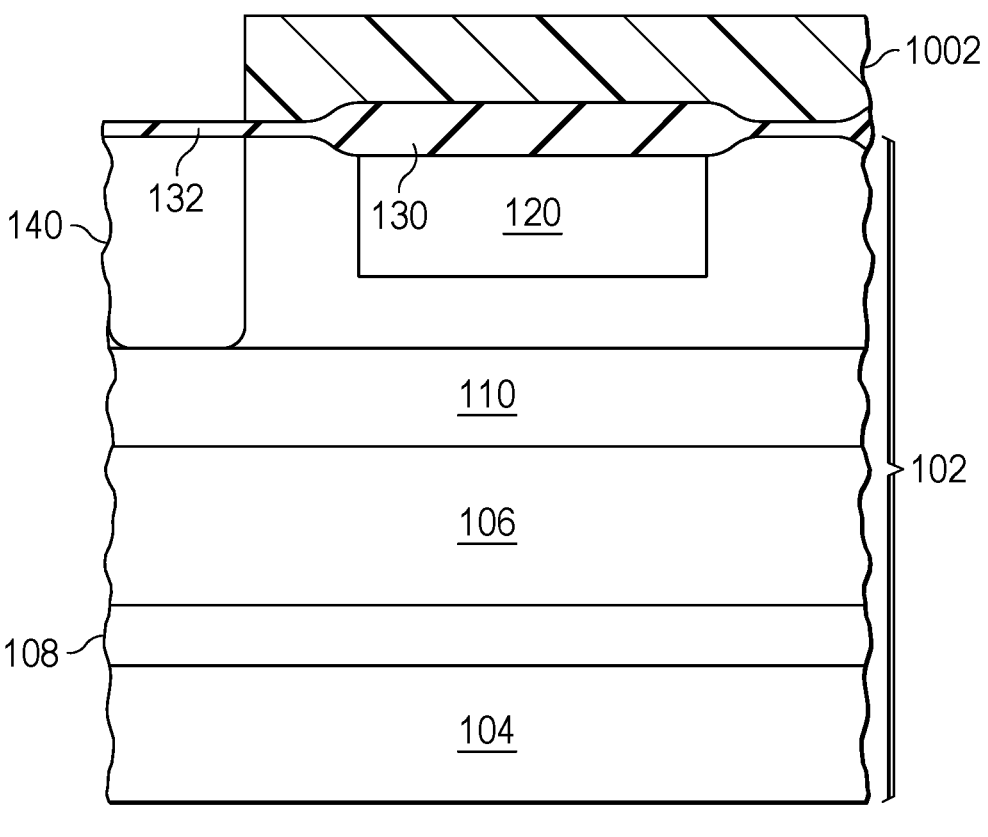

Referring to FIG. 10, the mask layer 704 and pad oxide layer 702 are removed. The mask layer 704 and pad oxide layer 702 may be removed using an etch process, such as a wet etch, selective to the materials of the mask layer 704 and the pad oxide layer 702. The removal of the pad oxide layer 702 may result in some removal of the dielectric isolation structure 130. Subsequently, a gate dielectric layer 132 is formed over the top major surface of the semiconductor substrate 102. The gate dielectric layer 132 may be formed by an oxidation process, which may permit the dielectric isolation structure 130 to further consume any remaining silicon layer 802.

A Dwell 140 is then formed in the semiconductor substrate 102. To form the Dwell 140, a photoresist 1002 is deposited (e.g., by spin-on) over the semiconductor substrate 102 and patterned using photolithography. The photoresist 1002 is patterned to have an opening corresponding to an area where the Dwell 140 is to be formed. With the patterned photoresist 1002, an implant is performed to implant dopants into the semiconductor substrate 102 thereby forming the Dwell 140. The dopant type and concentration of the Dwell 140 are as described above. Following the implant, the photoresist 1002 is removed, such as by ashing.

Figure 11:
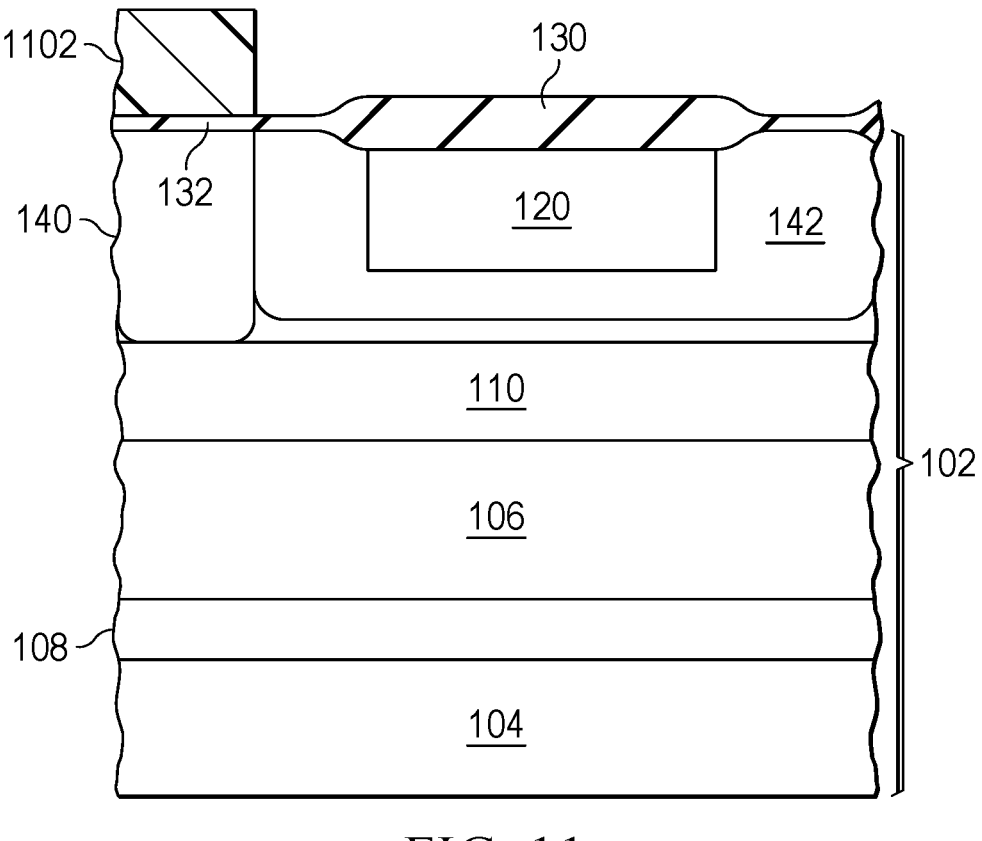

Referring to FIG. 11, a drift well 142 is formed in the semiconductor substrate 102. To form the drift well 142, a photoresist 1102 is deposited (e.g., by spin-on) over the semiconductor substrate 102 and patterned using photolithography. The photoresist 1102 is patterned to have an opening corresponding to an area where the drift well 142 is to be formed. With the patterned photoresist 1102, an implant is performed to implant dopants into the semiconductor substrate 102 thereby forming the drift well 142. The dopant type and concentration of the drift well 142 are as described above. Following the implant, the photoresist 1102 is removed, such as by ashing.

Figure 12:
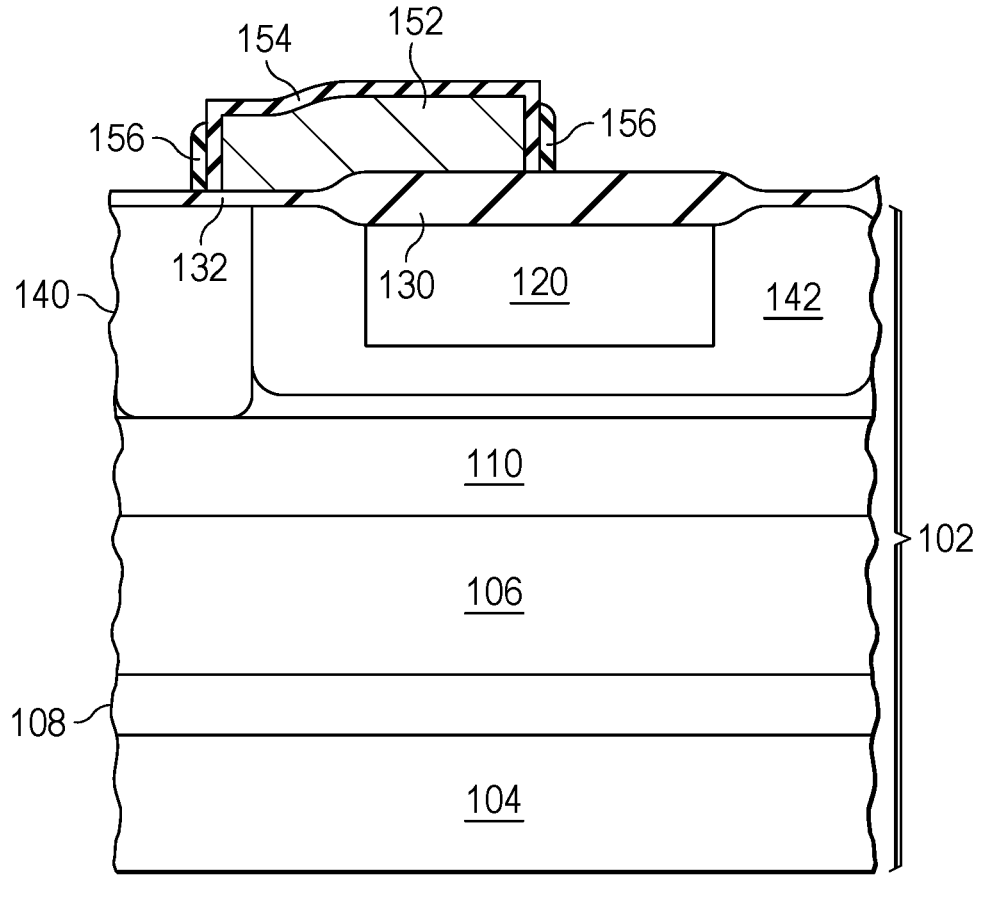

Referring to FIG. 12, a gate electrode 152 is formed over the semiconductor substrate 102. A material of the gate electrode 152 is deposited over the gate dielectric layer 132 and dielectric isolation structure 130. The material of the gate electrode 152 may be or include, for example, polysilicon (e.g., doped polysilicon), metal, the like, or a combination thereof. The material of the gate electrode 152 may be deposited by any appropriate deposition process, such as CVD, PVD, or the like. The material of the gate electrode 152 is then patterned into the gate electrode 152 using appropriate photolithography and etching processes.

A conformal oxide layer 154 is conformally formed on or over sidewall and upper surfaces of the gate electrode 152, and spacers 156 are formed on the conformal oxide layer 154 along sidewall surfaces of the gate electrode 152. In some examples, the conformal oxide layer 154 may be formed using an oxidation process to oxidize surfaces of the gate electrode 152. In some examples, the conformal oxide layer 154 may be formed by using an appropriate deposition process, such as CVD, ALD, or the like. A material of spacers 156 is then deposited on or over the conformal oxide layer 154 and on exposed surfaces of the gate dielectric layer 132 and dielectric isolation structure 130. The material of the spacers 156 is different from the material of the conformal oxide layer 154, and hence, can be selectively etched relative to the conformal oxide layer 154. The material of the spacers 156 may be or include any appropriate dielectric material, such as a nitride, the like, or a combination thereof, and may be deposited using an appropriate deposition process, such as CVD, ALD, or the like. The material of the spacers 156 is then anisotropically etched, such as by an RIE, to remove substantially lateral portions and such that spacers 156 remain on the conformal oxide layer 154 along sidewalls of the gate electrode 152.

Figure 13:
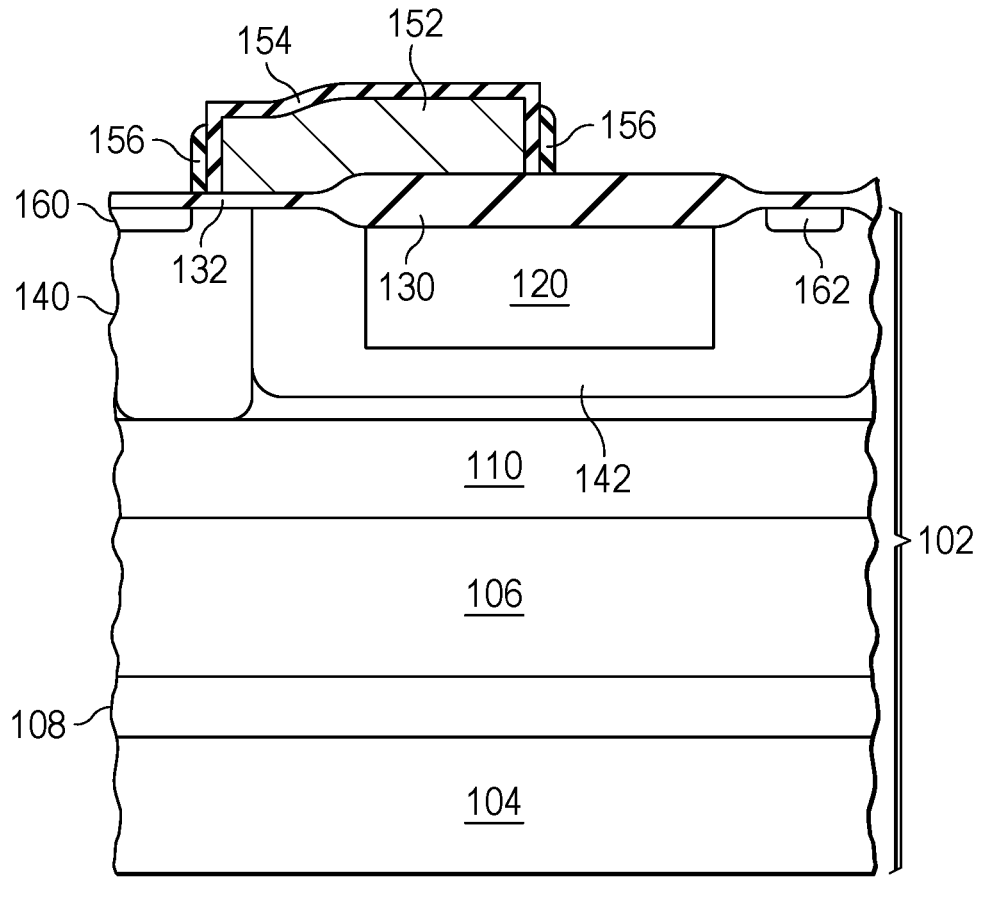

Referring to FIG. 13, a source region 160 and a drain region 162 are formed in the semiconductor substrate 102. To form the source region 160 and the drain region 162, a photoresist may be deposited (e.g., by spin-on) over the semiconductor substrate 102 and patterned using photolithography. With the patterned photoresist, an implant is performed to implant dopants into the semiconductor substrate 102 thereby forming the source region 160 and drain region 162. The dopant type and concentration of the source region 160 and drain region 162 are as described above. After the implant, the photoresist is removed, such as by ashing.

Referring to FIG. 1 (or FIG. 2), semiconductor-metal compound regions 164 are formed. To form the semiconductor-metal compound regions 164, exposed portions of the gate dielectric layer 132 and the conformal oxide layer 154 are removed. For example, the gate dielectric layer 132 and the conformal oxide layer 154 may be removed using an etch process. The removal of portions of the gate dielectric layer 132 and the conformal oxide layer 154 may also cause some loss from an exposed upper portion of the dielectric isolation structure 130. A metal of the semiconductor-metal compound regions 164 is deposited. The metal may be deposited using any appropriate deposition process, such as PVD, CVD, the like, or a combination thereof. An anneal process is implemented to react metal to underlying semiconductor material (e.g., silicon (Si)) to form the semiconductor-metal compound regions 164. A respective semiconductor-metal compound region 164 is therefore formed on the source region 160, on the drain region 162, and on the gate electrode 152. Unreacted metal is then removed, for example, using an etch process selective to the metal.

A dielectric layer 170 is formed, and a source contact 172 and a drain contact 174 are formed through the dielectric layer 170. The dielectric layer 170 may include one or multiple dielectric layers formed of any appropriate dielectric material and deposited by any appropriate deposition process, such as CVD, PVD, or the like. Openings are then formed through the dielectric layer 170 using photolithography and etching processes. Respective openings expose respective semiconductor-metal compound regions 164 that are disposed on the source region 160 and on the drain region 162. A barrier and/or adhesion layer may then be conformally deposited, such as by CVD, ALD, or the like, in the openings, and a fill metal may be deposited, such as by CVD, PVD, or the like, on the barrier and/or adhesion layer. Any barrier and/or adhesion layer and fill material on the top surface of the dielectric layer 170 may be removed by a chemical mechanical polish (CMP), for example. Hence, each of the source contact 172 and the drain contact 174 may include a barrier and/or adhesion layer and a fill metal.

FIGS. 14 through 17 illustrate cross-sectional views of the semiconductor device 300 of FIG. 3 at various stages of manufacturing according to an example method. Processing proceeds as described above with respect to FIGS. 5 and 6 for both a first region 302 and a second region 304 on the semiconductor substrate 102.

Figure 14:
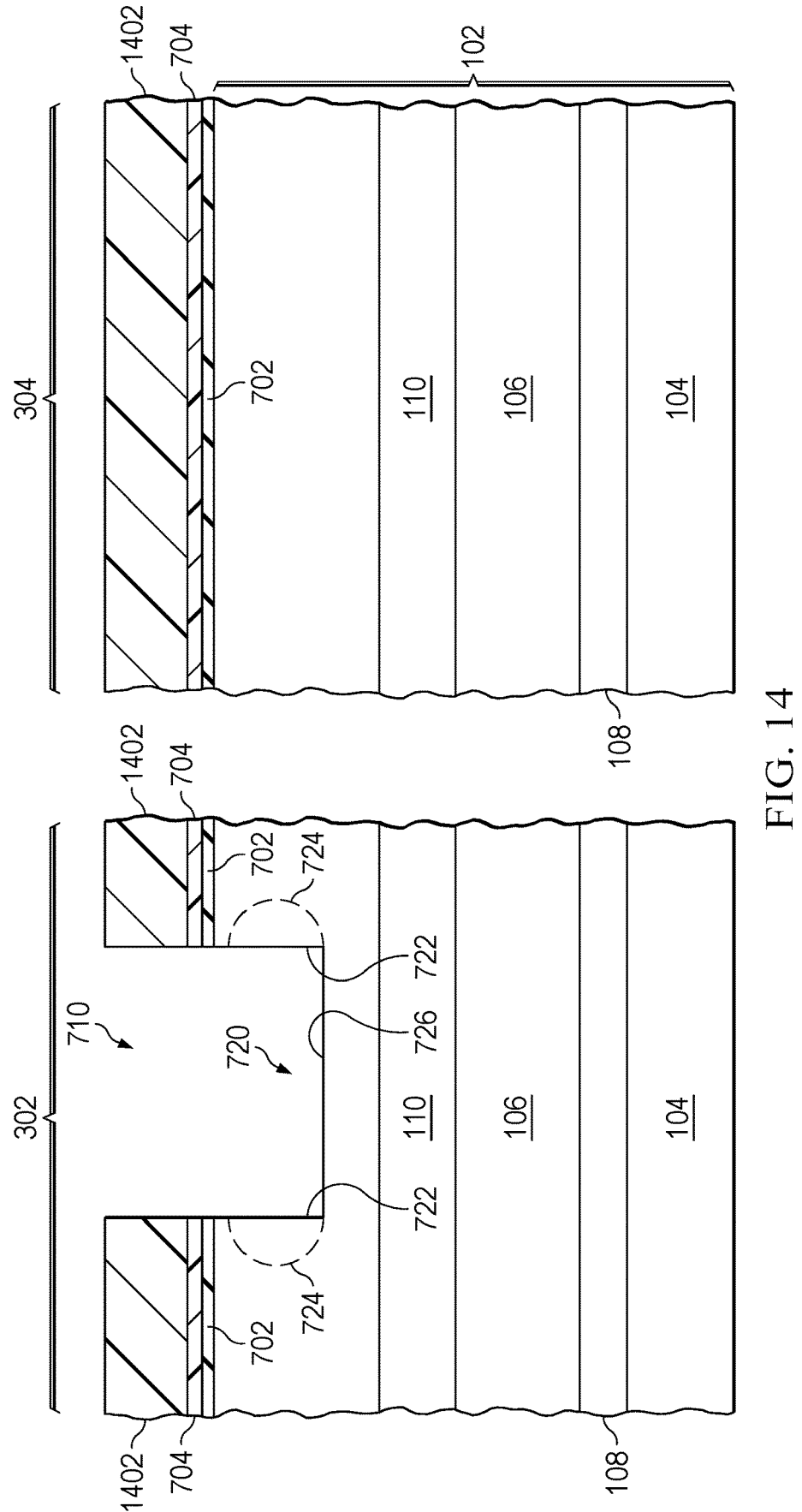
FIGS. 14, 15, 16, and 17 are cross-sectional views of the semiconductor device of FIG. 3 at various stages of manufacturing according to some examples.

Referring to FIG. 14, a pad oxide layer 702 is formed over a top major surface of the semiconductor substrate 102 in the first region 302 and the second region 304, and a mask layer 704 is formed over the pad oxide layer 702 in the first region 302 and the second region 304. The pad oxide layer 702 and the mask layer 704 may be formed as described above with respect to FIG. 7.

A photoresist 1402 is formed over the mask layer 704 in the first region 302 and the second region 304. The photoresist 706 may be formed like described in FIG. 7. The photoresist 1402 has an opening 710 therethrough in the first region 302. The opening 710, when formed, exposes the mask layer 704 in the first region. As illustrated, no opening is through the photoresist 1402 in the second region 304. With the photoresist 1402 patterned with the opening 710, an etch process is performed to remove respective portions of the mask layer 704 and the pad oxide layer 702 that align with the opening 710, like described above with respect to FIG. 7. Subsequently, the semiconductor substrate 102 in the first region 302 that is exposed through the opening 710 is etched using the mask layer 704 and/or photoresist 706 as a mask. The etching of the semiconductor substrate 102 forms a recess 720 in the semiconductor substrate 102, like described above with respect to FIG. 7. Since no opening is through the photoresist 1402 (and/or mask layer 704) in the second region 304, no recess is formed in the semiconductor substrate 102 in the second region 304. Following the etching of the semiconductor substrate 102, any remaining photoresist 706 is removed, such as by ashing.

Figure 15:
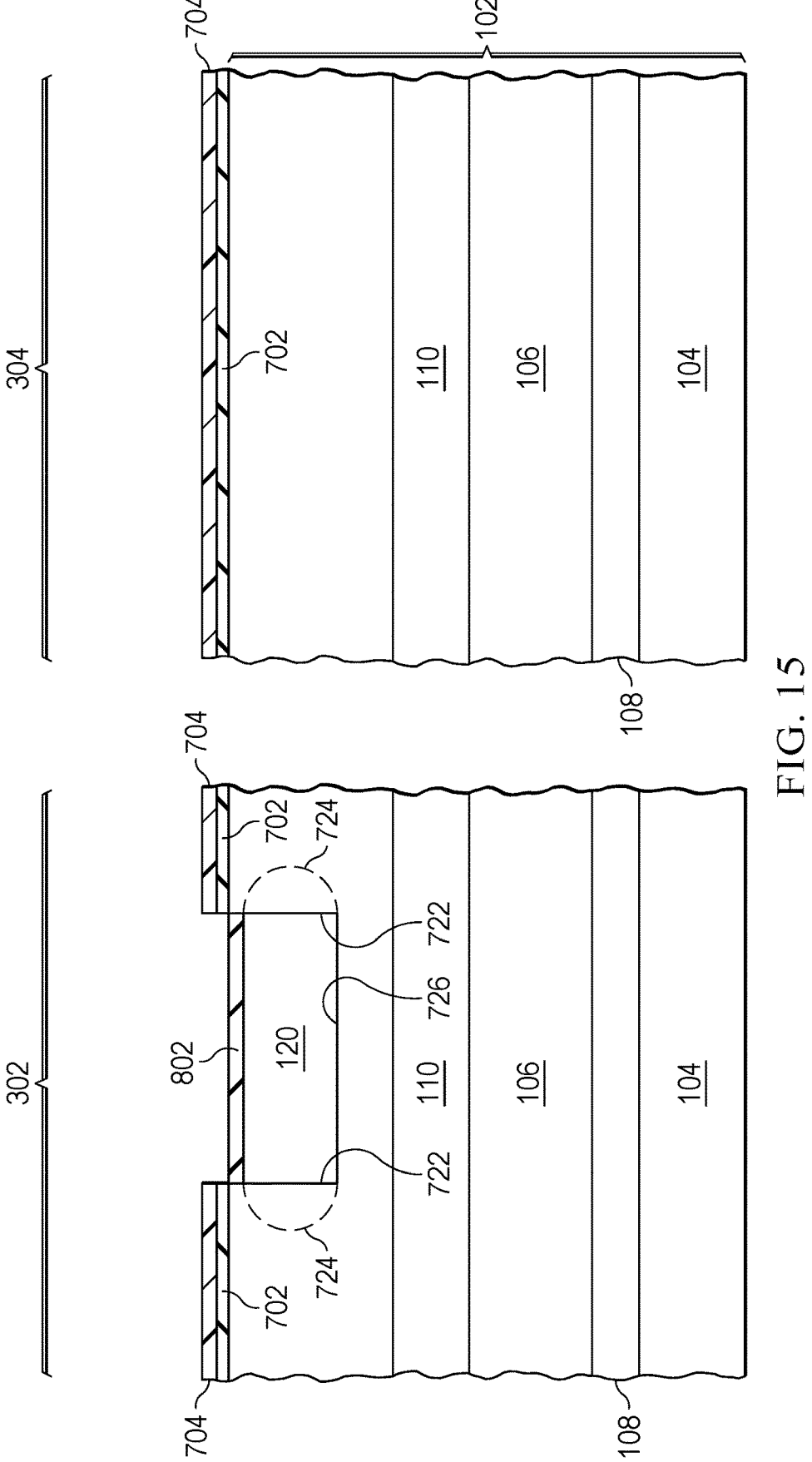

Referring to FIG. 15, a wide bandgap material 120 and a silicon layer 802 are epitaxially grown in the recess 720 in the first region 302, like described with respect to FIG. 8. Since the mask layer 704 in the second region 304 has no opening and/or the semiconductor substrate 102 is not exposed in the second region, neither a wide bandgap material nor a silicon layer is epitaxially grown in the second region 304.

Figure 16:
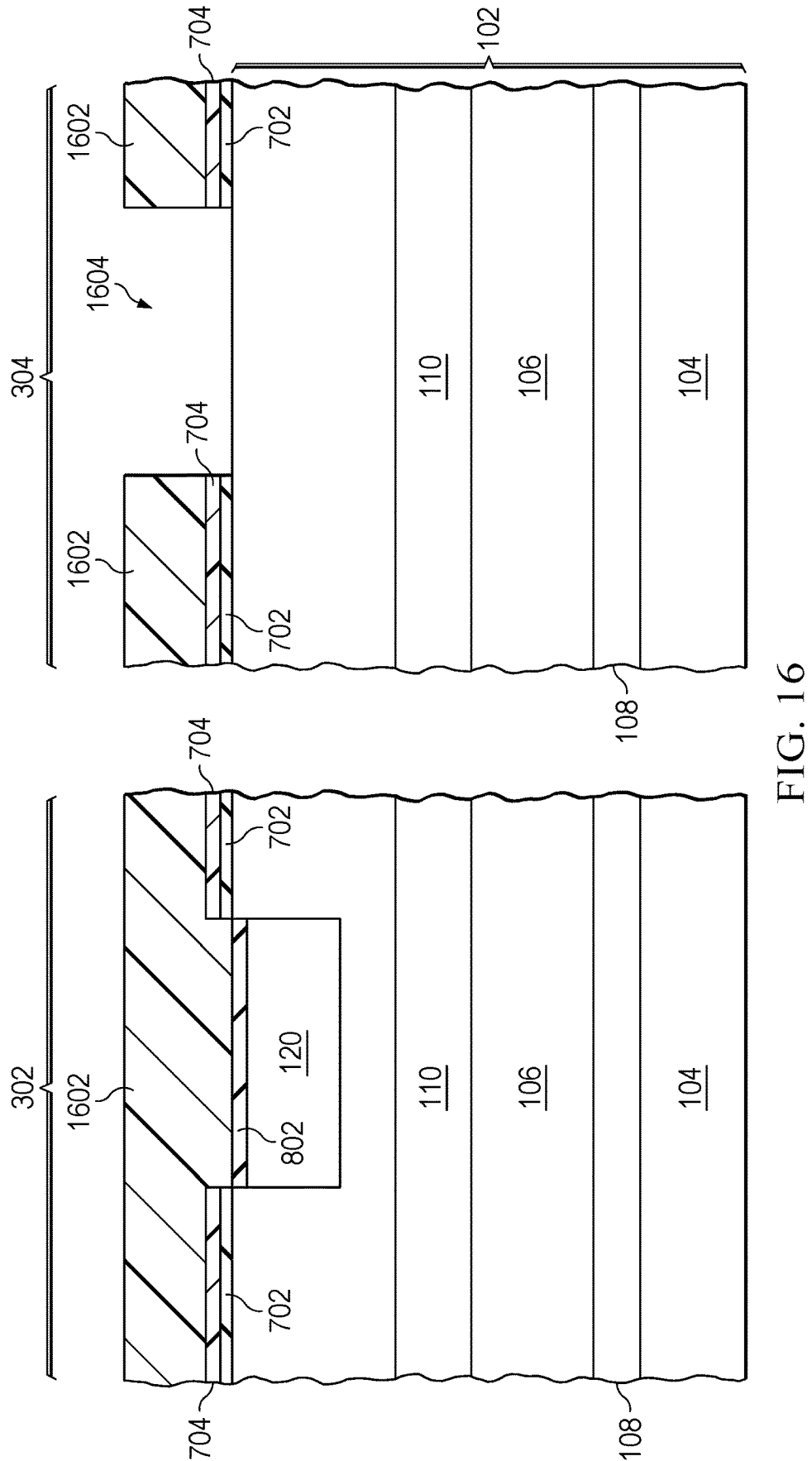

Referring to FIG. 16, a photoresist 1602 is formed over the mask layer 704 and silicon layer 802 in the first region 302 and over the mask layer 704 in the second region 304. The photoresist 1602 may be deposited by spin-on and patterned using photolithography. The photoresist 1602 has an opening 1604 therethrough in the second region 304. The opening 1604, when formed, exposes the mask layer 704. As illustrated, no opening is through the photoresist 1602 in the first region 302. With the photoresist 1602 patterned with the opening 1604, an etch process is performed to remove respective portions of the mask layer 704 and the pad oxide layer 702 that align with the opening 1604. The etch process to remove the portions of the mask layer 704 and the pad oxide layer 702 may be an anisotropic etch and/or an isotropic etch. Removing the portions of the mask layer 704 and the pad oxide layer 702 exposes a portion of the top major surface of the semiconductor substrate 102. Following the removal of the portions of the mask layer 704 and the pad oxide layer 702, any remaining photoresist 1602 is removed, such as by ashing.

Figure 17:
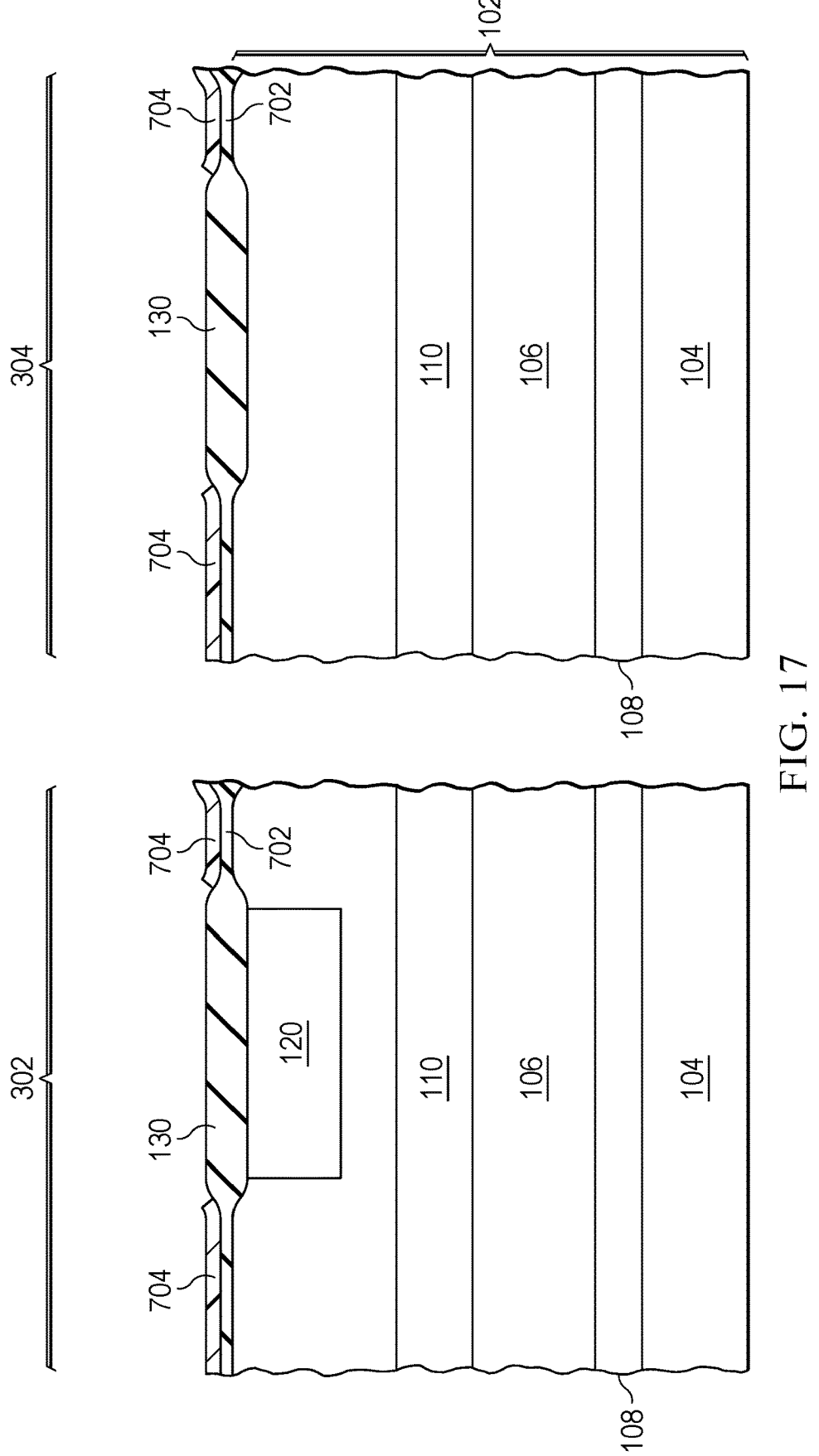

Referring to FIG. 17, an oxidation process is performed to form respective dielectric isolation structures 130 in the first region 302 and the second region 304. The oxidation process oxidizes the silicon layer 802 exposed through the mask layer 704 in the first region 302, like described above with respect to FIG. 9. In the second region 304, the oxidation process oxidizes the semiconductor material of the semiconductor substrate 102 exposed through the mask layer 704 and may further laterally penetrate under the mask layer 704 from the opening to oxide the semiconductor material (e.g., silicon) at the top major surface of the semiconductor substrate 102.

Subsequently, the semiconductor substrate 102 may undergo the same processing in the first region 302 and the second region 304 that is described above with respect to FIGS. 10 through 13 and FIG. 1 (or FIG. 2) to form the semiconductor device 300 of FIG. 3.

As illustrated by the processing of FIGS. 14 through 17, the wide bandgap material 120 may be formed in the semiconductor substrate 102 using the photolithography processing (e.g., to form the photoresist 1402) used to form the dielectric isolation structure 130 in the first region 302. One additional photolithography process (e.g., to form the photoresist 1602), and hence, one additional lithography mask, may be implemented in processing to implement the semiconductor device 300 of FIG. 3.

Although various examples have been described in detail, it should be understood that various changes, substitutions, and alterations can be made therein without departing from the scope defined by the appended claims.

What is claimed is:

1. A semiconductor device comprising:
  a first laterally-diffused metal-oxide-semiconductor (LD-MOS) transistor comprising:
    a drain region disposed in a semiconductor material of a semiconductor substrate;
    a source region disposed in the semiconductor material of the semiconductor substrate; and
    a drift well disposed laterally between the drain region and the source region, the drift well including a wide bandgap material, the wide bandgap material having a bandgap energy that is larger than a bandgap energy of the semiconductor material of the semiconductor substrate,
  wherein the wide bandgap material interfaces with the semiconductor material at a bottom surface and at linear sidewall surfaces.

2. The semiconductor device of claim 1, wherein the bandgap energy of the wide bandgap material is greater than 1.5 electron volt (eV).

3. The semiconductor device of claim 1, further comprising a local oxidation of silicon (LOCOS) structure disposed over the wide bandgap material.

4. The semiconductor device of claim 1, wherein the wide bandgap material includes silicon carbide (SiC).

5. The semiconductor device of claim 4, wherein:
a concentration of carbon in the silicon carbide (SiC) of the wide bandgap material increases from an interface between the semiconductor material and the wide bandgap material vertically along a direction to a peak carbon concentration; and
a concentration of carbon in the silicon carbide (SiC) of the wide bandgap material decreases vertically along the direction from the peak carbon concentration.

6. The semiconductor device of claim 1, wherein the wide bandgap material includes gallium nitride (GaN).

7. The semiconductor device of claim 1, wherein the wide bandgap material interfaces with the semiconductor material at a bottom surface and at curved sidewall surfaces.

8. The semiconductor device of claim 1, wherein the semiconductor material is silicon.

9. The semiconductor device of claim 1, wherein the drain region, the source region, and the drift well are respectively a first drain region, a first source region, and a first drift well, and further comprising a second LDMOS transistor comprising:
a second drain region disposed in the semiconductor material of the semiconductor substrate;
a second source region disposed in the semiconductor material of the semiconductor substrate; and
a second drift well disposed, at least in part, laterally between the second drain region and the second source region, the second drift well not including a wide bandgap material.

10. A semiconductor device comprising:
a first laterally-diffused metal-oxide-semiconductor (LD-MOS) transistor comprising:
a first gate electrode structure disposed over a first gate oxide layer and a first local oxidation of silicon (LOCOS) structure;
a first drain region disposed in a semiconductor material of a semiconductor substrate;
a first source region disposed in the semiconductor material of the semiconductor substrate, the first gate oxide layer and the first LOCOS structure being disposed laterally between the first drain region and the first source region; and
a first drift well disposed, at least in part, laterally between the first drain region and the first source region, the first drift well including a wide bandgap material, the wide bandgap material being disposed underlying the first LOCOS structure, the wide bandgap material having a bandgap energy that is larger than a bandgap energy of the semiconductor material of the semiconductor substrate,
wherein the wide bandgap material interfaces with the semiconductor material at a bottom surface and at linear sidewall surfaces.

11. The semiconductor device of claim 10, wherein the wide bandgap material includes silicon carbide (SiC), gallium nitride (GaN), or a combination thereof.

12. The semiconductor device of claim 10, further comprising a second LDMOS transistor comprising:
a second gate electrode structure disposed over a second gate oxide layer and a second LOCOS structure;
a second drain region disposed in the semiconductor material of the semiconductor substrate;
a second source region disposed in the semiconductor material of the semiconductor substrate, the second gate oxide layer and the second LOCOS structure being disposed laterally between the second drain region and the second source region; and
a second drift well disposed, at least in part, laterally between the second drain region and the second source region, the second drift well not including a wide bandgap material.

13. A semiconductor device comprising:
a first laterally-diffused metal-oxide-semiconductor (LD-MOS) transistor comprising:
a drain region disposed in a semiconductor material of a semiconductor substrate;
a source region disposed in the semiconductor material of the semiconductor substrate; and
a drift well disposed laterally between the drain region and the source region, the drift well including a wide bandgap material, the wide bandgap material having a bandgap energy that is larger than a bandgap energy of the semiconductor material of the semiconductor substrate,
wherein:
the wide bandgap material includes silicon carbide (SiC);
a concentration of carbon in the silicon carbide increases from an interface between the semiconductor material and the wide bandgap material vertically along a direction to a peak carbon concentration; and
a concentration of carbon in the silicon carbide decreases vertically along the direction from the peak carbon concentration.

14. The semiconductor device of claim 13, wherein the bandgap energy of the wide bandgap material is greater than 1.5 electron volt (eV).

15. The semiconductor device of claim 13, further comprising a local oxidation of silicon (LOCOS) structure disposed over the wide bandgap material.

16. The semiconductor device of claim 13, wherein the semiconductor material is silicon.

* * * * *